United States Patent
Veitsel et al.

(10) Patent No.: US 9,759,753 B2
(45) Date of Patent: Sep. 12, 2017

(54) DIGITAL SWEEP TYPE SPECTRUM ANALYZER WITH UP/DOWN FREQUENCY CONVERSION

(71) Applicant: Topcon Positioning Systems, Inc., Livermore, CA (US)

(72) Inventors: Andrey V. Veitsel, Moscow (RU);
Victor A. Prasolov, Moscow (RU);
Dmitry D. Murzinov, Moscow (RU);
Igor A. Orlovsky, Moscow (RU)

(73) Assignee: Topcon Positioning Systems, Inc., Livermore, CA (US)

( * ) Notice: Subject to any disclaimer, the term of this patent is extended or adjusted under 35 U.S.C. 154(b) by 278 days.

(21) Appl. No.: 14/654,881

(22) PCT Filed: Nov. 18, 2014

(86) PCT No.: PCT/RU2014/000876
§ 371 (c)(1),
(2) Date: Jun. 23, 2015

(87) PCT Pub. No.: WO2016/080856
PCT Pub. Date: May 26, 2016

(65) Prior Publication Data
US 2016/0341774 A1    Nov. 24, 2016

(51) Int. Cl.
*G01R 23/16*    (2006.01)
*G01R 23/173*    (2006.01)
(52) U.S. Cl.
CPC ........... *G01R 23/16* (2013.01); *G01R 23/173* (2013.01)

(58) Field of Classification Search
None
See application file for complete search history.

(56) References Cited

U.S. PATENT DOCUMENTS

| 4,054,785 A | 10/1977 | Lehmann | |
|---|---|---|---|
| 4,771,232 A * | 9/1988 | Betts | G01R 23/16 |
| | | | 324/76.15 |

(Continued)

FOREIGN PATENT DOCUMENTS

SU    1451617    1/1989

OTHER PUBLICATIONS

Search Report in PCT/RU/2014/000876, dated Sep. 3, 2015.

*Primary Examiner* — Paresh Patel
(74) *Attorney, Agent, or Firm* — Bardmesser Law Group

(57) ABSTRACT

System for digital sweep type spectrum analysis with up/down frequency provides measurements of frequency spectrum of complex analog baseband input signal. The signal is quantized into three levels with fs based on the bandwidth of the input signal. Four multiplexers, a first block of registers and a block of adders perform operations equivalent to complex multiplication of the quadrature components. Two complex signals with up and down shifted spectrum are produced by the adders. The quadrature components are inputted to the accumulators with reset, which act as low-pass filters and accumulate several samples at a constant frequency $f_{LO}$ of the local oscillator. Levels of two accumulated complex samples are estimates of input signal spectrum in two frequency points $+f_{LO}$ and $-f_{LO}$. A sweep controller changes a frequency of the local oscillator from zero up to fs/2. Estimates of the input signal spectrum are generated sequentially in range $-fs/2$ to $+fs/2$.

14 Claims, 5 Drawing Sheets

(56) References Cited

U.S. PATENT DOCUMENTS

| | | | |
|---|---|---|---|
| 5,038,096 A | 8/1991 | Obie et al. | |
| 6,275,020 B1 * | 8/2001 | Nagano | G01R 23/173 324/76.19 |
| 6,509,728 B1 | 1/2003 | Uchino et al. | |
| 6,545,728 B1 * | 4/2003 | Patel | H03D 1/24 348/725 |
| 6,700,366 B2 * | 3/2004 | Truesdale | G01R 23/145 324/76.27 |
| 8,581,768 B1 * | 11/2013 | Pagnanelli | H03M 3/30 341/143 |

* cited by examiner

US 9,759,753 B2

DIGITAL SWEEP TYPE SPECTRUM ANALYZER WITH UP/DOWN FREQUENCY CONVERSION

BACKGROUND OF THE INVENTION

Communication systems and satellite navigation systems often need spectrum analyzers. Swept spectrum analyzers have been in use for many years, because they are less complex compared to FFT (Fast Fourier Transform) spectrum analyzers. Some analyzers have both analog and digital signal processing means.

U.S. Pat. No. 6,700,366, entitled "Very fast swept spectrum analyzer", describes a system in which the signal spectrum is formed by mixing a ramping local oscillator and an input signal to generate an IF signal, the resulting IF (Intermediate Frequency) signal having a phase change with respect to the input signal, the phase change including a quadratic portion. For analysis, the IF signal is processed such that the quadratic component of the phase change is removed. IF processing circuitry includes a resolution bandwidth filter and an analog-to-digital converter.

U.S. Pat. No. 6,275,020, entitled "Frequency analysis method and sweep type spectrum analyzer", describes a sweep type spectrum analyzer, where analyzing the frequency components included in the signal to be measured are based on the correspondence relation between a power of each of the intermediate frequency signals and a frequency of the main swept frequency signal, an inverse swept signal is multiplied by each intermediate frequency signal, the inverse swept signal being frequency-swept in the reverse direction to the frequency transition direction of the associated intermediate frequency signal, and a constant frequency component obtained from the results of the multiplications is extracted as a frequency spectrum.

U.S. Pat. No. 4,771,232, entitled "Non-interruptive spectrum analyzer for digital modems", describes a system that provides extracting spectral data from the actual received modem signal, where multipliers are used in the digital frequency converter.

However, devices with analog components are not always stable and provide less accuracy compared to fully digital solutions. The present invention is intended as a simple system for full digital sweep type spectrum analysis with up/down frequency conversion, where analysis time is less than half compared to sweep type spectrum analyzers with only down frequency conversion. The system provides measurements of frequency spectrum of an input complex analog baseband signal without use of multiplication operations for frequency conversion.

SUMMARY OF THE INVENTION

The present invention is intended for creating a system for digital sweep type spectrum analysis with up/down frequency conversion. The system provides measurements of frequency spectrum of complex analog baseband input signal, where analysis time is less than half compared to sweep type spectrum analyzers with only down frequency conversion. First, a complex analog input signal is quantized into three levels (−1; 0; +1) with a sampling frequency fs agreed with the bandwidth of the input signal. Then, a block of four 9-to-1 multiplexers, a first block of registers and a block of adders perform operations that are equivalent to mathematical complex multiplication of the quadrature components of the digitized input signal and the quadrature components of the local oscillator, but without using real multiplications.

Two complex signals with up-shifted and down-shifted spectrum are formed at the output of the block of adders. Further, the quadrature components of these complex signals are inputted to the block of accumulators with reset, which act as low-pass filters (LPF) and accumulate several samples at a constant frequency $f_{LO}$ of the local oscillator. Levels of two accumulated complex samples are estimates of the input signal spectrum in two frequency points $+f_{LO}$ and $-f_{LO}$. A sweep controller changes the frequency stepwise of the local frequency-tunable oscillator from zero to fs/2 by steps that compared to the LPF bandwidth, where estimates of the input signal spectrum generated sequentially in the range from −fs/2 to +fs/2. These spectral estimates are analyzed and stored using a data analysis and storing logic, where they are periodically updated and may be used, e.g., for displaying.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED FIGURES

The accompanying drawings, which are included to provide a further understanding of the invention and are incorporated in and constitute a part of this specification and together with the description serve to explain the principles of the invention.

Figure 3A:
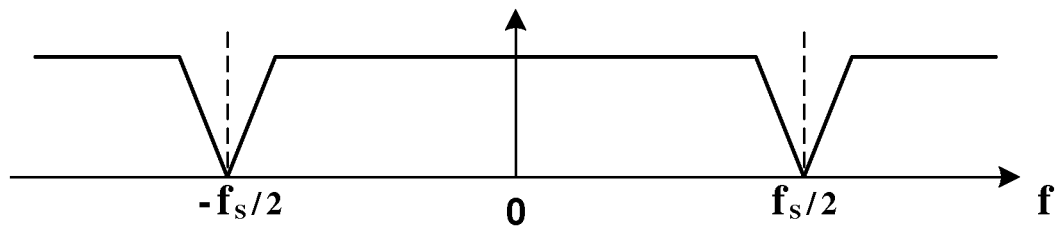

FIG. 3*a* is an example of the spectrum of a digitized complex input signal.

Figure 3B:
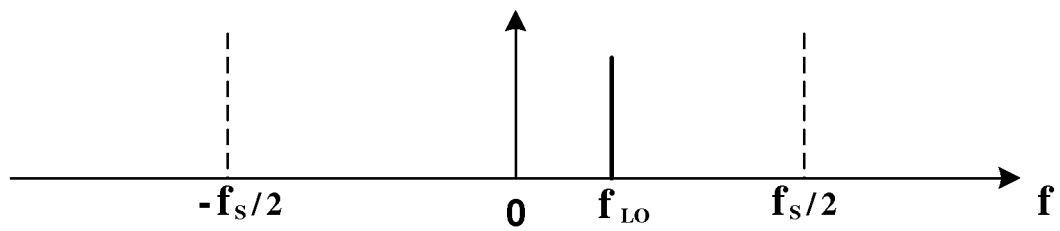

FIG. 3*b* is an example of the spectrum of the signal of a quadrature local oscillator.

Figure 3C:
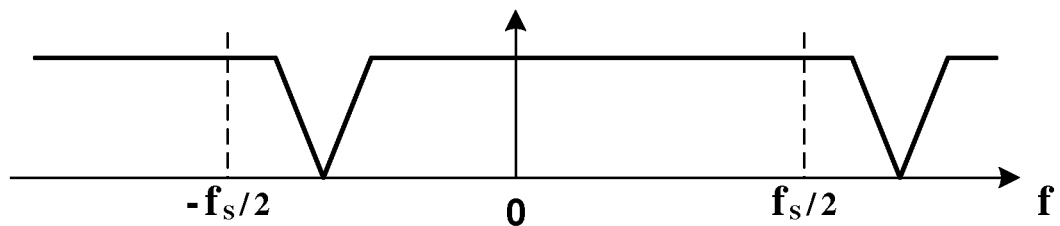

FIG. 3*c* is a spectrum of an up converted digitized complex input signal of FIG. 3*a*.

Figure 3D:
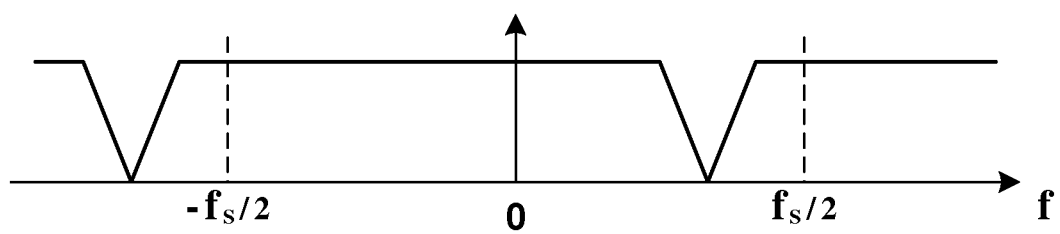

FIG. 3*d* is a spectrum of a down converted digitized complex input signal of FIG. 3*a*.

Figure 4:
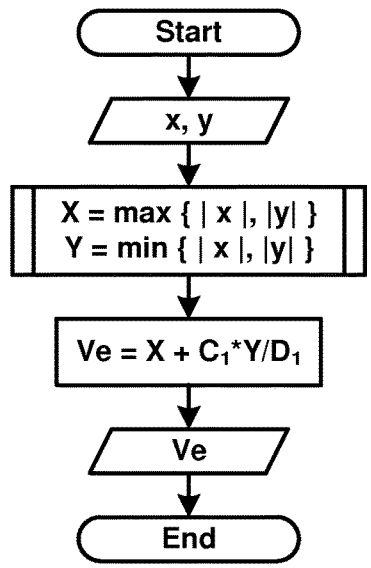

FIG. 4 is an example of the flowchart of a primitive algorithm of estimating for the case of only sector with borders (0, π/4).

Figure 5:
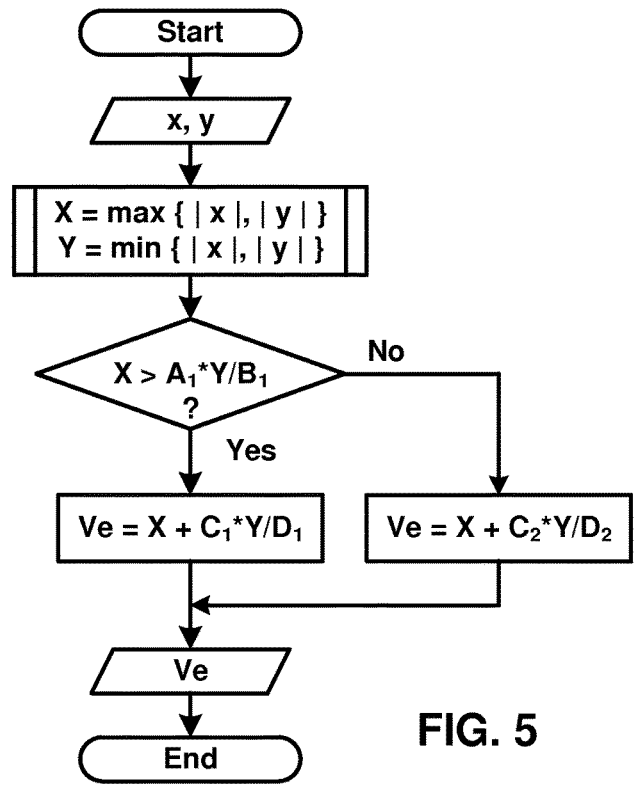

FIG. 5 is an example of the flowchart of the estimation algorithm when octant (0, π/4) is divided into two sectors.

Figure 6:
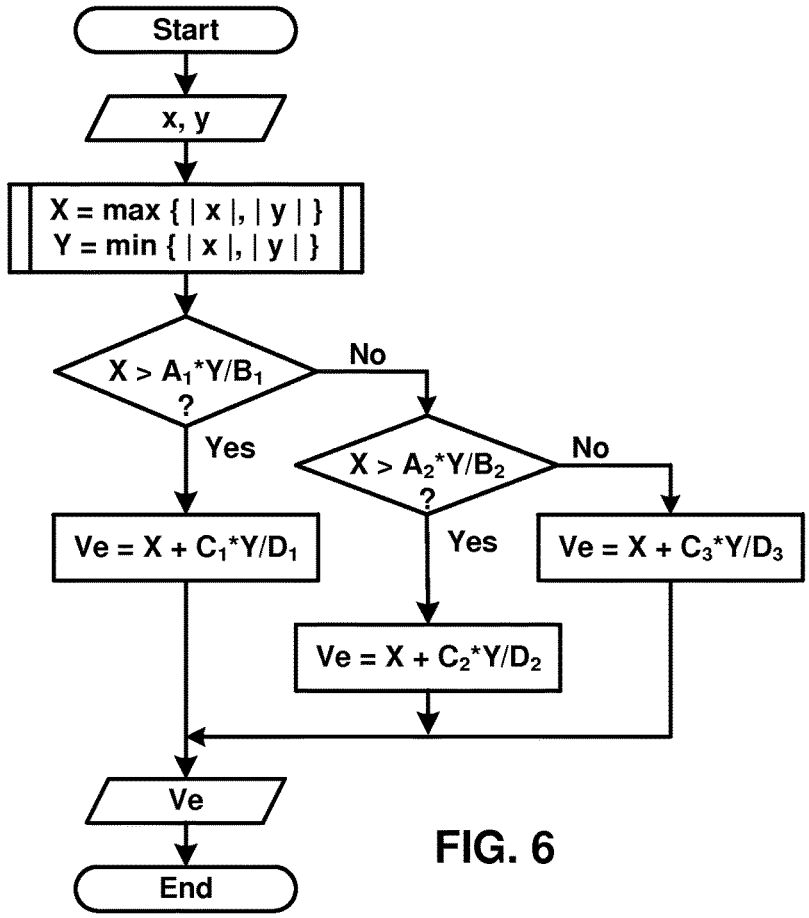

FIG. 6 is an example of the flowchart of the estimation algorithm when octant (0, π/4) is divided into three sectors.

Figure 7:
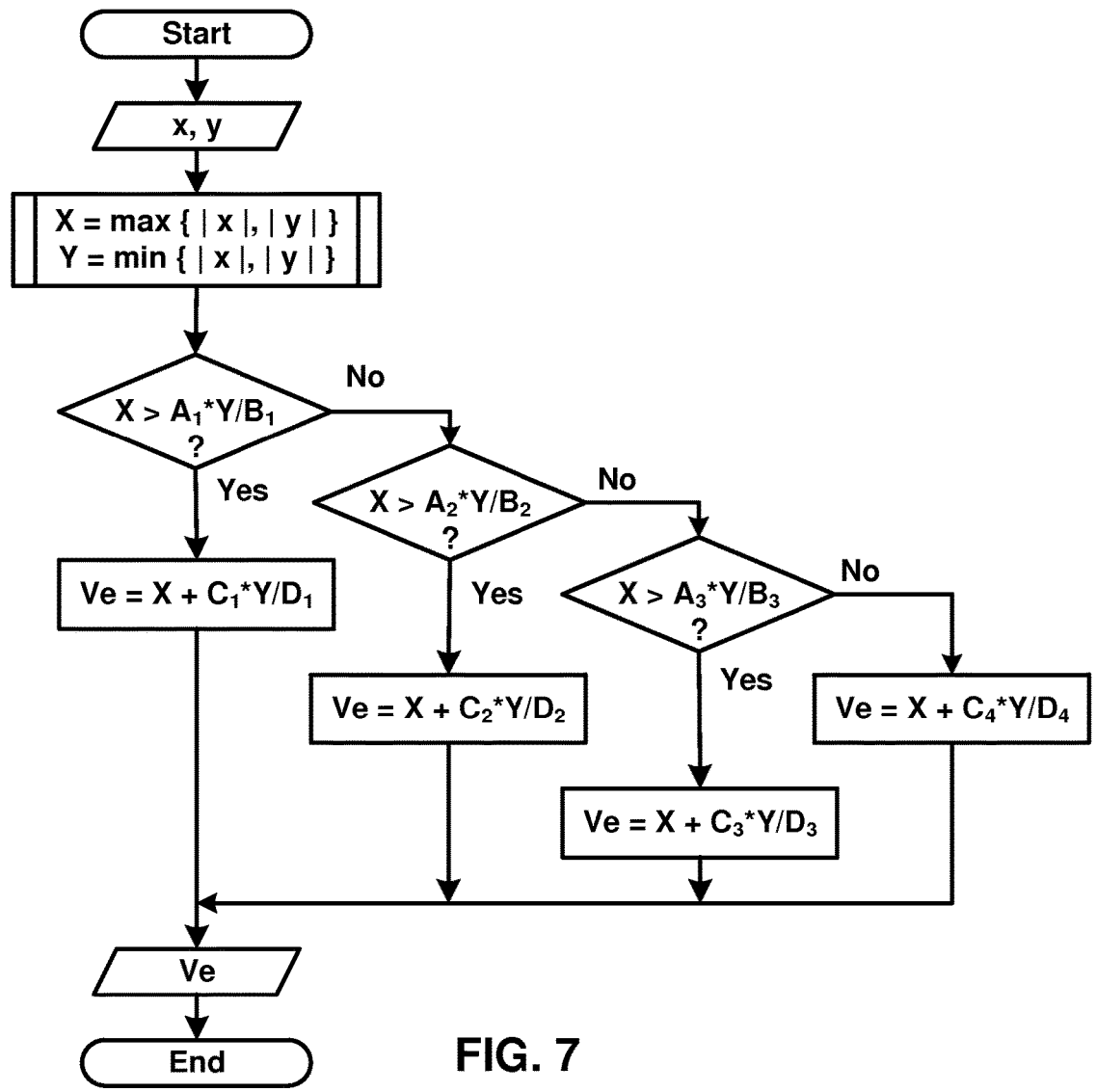

FIG. 7 is an example of the flowchart of the estimation algorithm when octant (0, π/4) is divided into four sectors.

DETAILED DESCRIPTION OF THE PREFERRED EMBODIMENTS

Reference will now be made in detail to the preferred embodiments of the present invention, examples of which are illustrated in the accompanying drawings.

Figure 1:
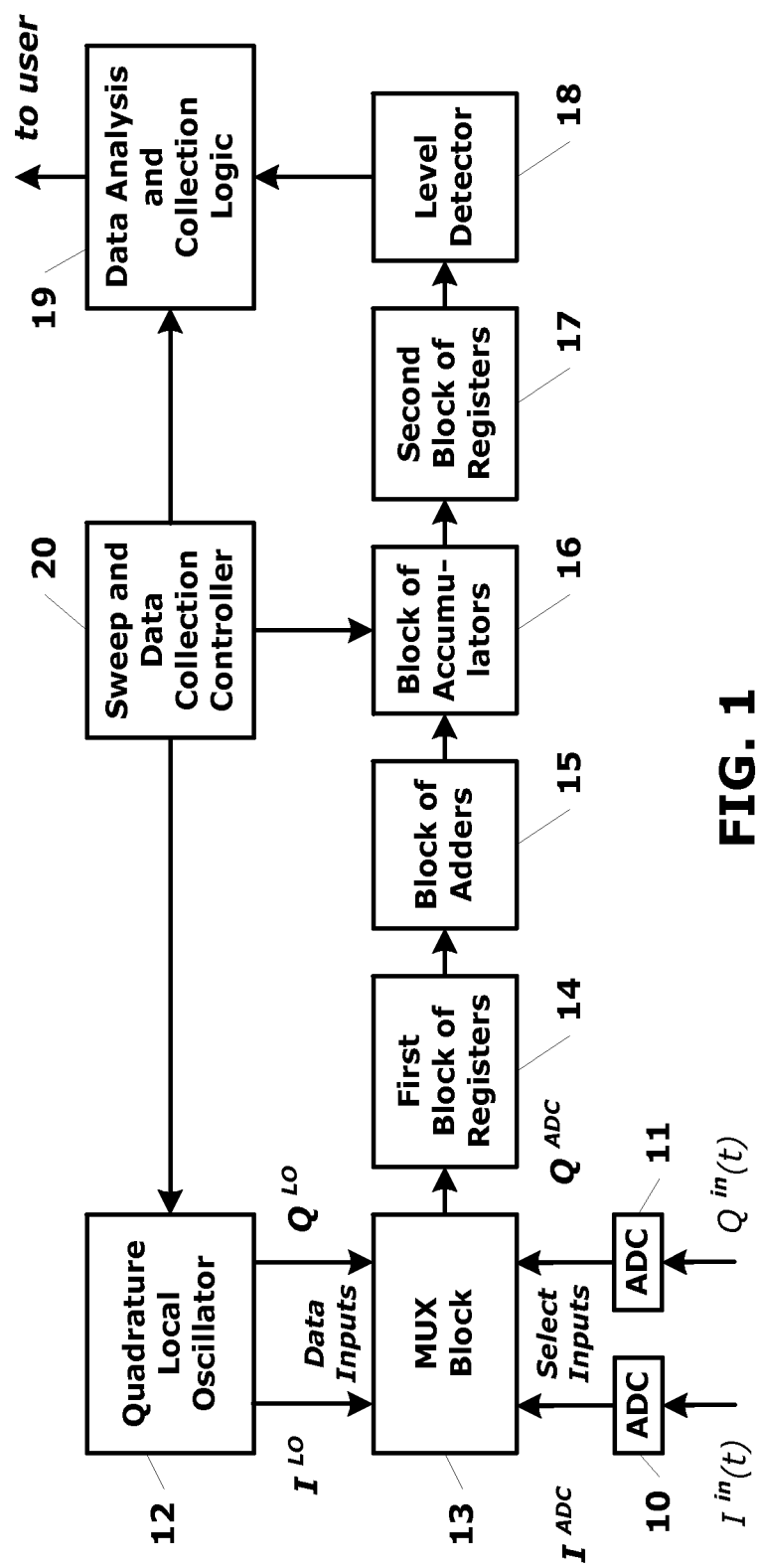
FIG. 1 is a functional block diagram for an embodiment of a digital sweep type spectrum analyzer with up/down frequency conversion.

FIG. 1 shows a functional block diagram for a digital sweep type spectrum analyzer with up/down frequency conversion, which provides a frequency spectrum of an complex analog baseband input signal.

The analog quadrature components $I^{in}(t)$ and $Q^{in}(t)$ of the complex input signal are pre-quantized with a sampling frequency fs by two analog-to-digital converters (ADC) 10, 11 into three levels (−1; 0; +1):

$I_n^{ADC} = -1$, if $I^{in}(n*T_s) < -U_L$;

$I_n^{ADC} = 0$, if $-U_L \leq I^{in}(n*T_s) \leq +U_L$;

$I_n^{ADC} = +1$, if $I^{in}(n*T_s) > +U_L$;

$Q_n^{ADC} = -1$, if $Q^{in}(n*T_s) < -U_L$;

$Q_n^{ADC} = 0$, if $-U_L \leq Q^{in}(n*T_s) \leq +U_L$;

$Q_n^{ADC} = +1$, if $Q^{in}(n*T_s) > +U_L$;

here $U_L$ is the preset level;
$T_s = 1/f_s$ is the sampling period,
$n = 0, 1, 2, \ldots$;

where sampling frequency $f_s$ corresponds to the bandwidth $B_{in}$ of the input signal ($f_s \geq B_{in}$). An example of the spectrum of a digitized input signal is shown in FIG. 3a.

An example of the signal spectrum of a quadrature local oscillator (LO) 12 with the quadrature components ($I^{LO}$, $Q^{LO}$) is shown in FIG. 3b. A complex up-converted signal with quadrature components ($I^U$, $Q^U$) and a complex down-converted signal with quadrature components ($I^D$, $Q^D$) can be obtained through complex multiplication of the quadrature components ($I^{ADC}$, $Q^{ADC}$) and the quadrature components ($I^{LO}$, $Q^{LO}$)) of LO by formulas:

$$\left. \begin{array}{l} I_n^U = I_n^{ADC} \cdot I_n^{LO} - Q_n^{ADC} \cdot Q_n^{LO} \\ Q_n^U = I_n^{ADC} \cdot Q_n^{LO} + Q_n^{ADC} \cdot I_n^{LO} \end{array} \right\} \quad (1)$$

$$\left. \begin{array}{l} I_n^D = I_n^{ADC} \cdot I_n^{LQO} + Q_n^{ADC} \cdot Q_n^{LQO} \\ Q_n^D = -I_n^{ADC} \cdot Q_n^{LQO} + Q_n^{ADC} \cdot I_n^{LQO} \end{array} \right\} \quad (2)$$

The implementation of equations (1) and (2) would require four real multiplications:

$$R_n^{II} = I_n^{ADC} \cdot I_n^{LQO}, \quad (3)$$

$$R_n^{QQ} = Q_n^{ADC} \cdot Q_n^{LQO}, \quad (4)$$

$$R_n^{IQ} = I_n^{ADC} \cdot Q_n^{LQO}, \quad (5)$$

$$R_n^{QI} = Q_n^{ADC} \cdot I_n^{LQO}, \quad (6)$$

In the present invention, the values $R_n^{II}$, $R_n^{QQ}$, $R_n^{IQ}$, $R_n^{QI}$ are produced without using multiplication by a MUX block 13 comprising four 9-to-1 multiplexers operating in accordance with the combined logic table

| Select inputs | | Outputs | | | |
|---|---|---|---|---|---|
| $I^{ADC}$ | $Q^{ADC}$ | MUX 1 $R^{II}$ | MUX 2 $R^{QQ}$ | MUX 3 $R^{IQ}$ | MUX 4 $R^{QI}$ |
| 1) 0 | 0 | 0 | 0 | 0 | 0 |
| 2) 0 | +1 | 0 | $Q^{LO}$ | 0 | $I^{LO}$ |
| 3) 0 | −1 | 0 | $-Q^{LO}$ | 0 | $-I^{LO}$ |
| 4) +1 | 0 | $I^{LO}$ | 0 | $Q^{LO}$ | 0 |
| 5) −1 | 0 | $-I^{LO}$ | 0 | $-Q^{LO}$ | 0 |
| 6) +1 | +1 | $I^{LO}$ | $Q^{LO}$ | $Q^{LO}$ | $I^{LO}$ |
| 7) −1 | −1 | $-I^{LO}$ | $-Q^{LO}$ | $-Q^{LO}$ | $-I^{LO}$ |
| 8) +1 | −1 | $I^{LO}$ | $-Q^{LO}$ | $Q^{LO}$ | $-I^{LO}$ |
| 9) −1 | +1 | $-I^{LO}$ | $Q^{LO}$ | $-Q^{LO}$ | $I^{LO}$ |

Figure 2:
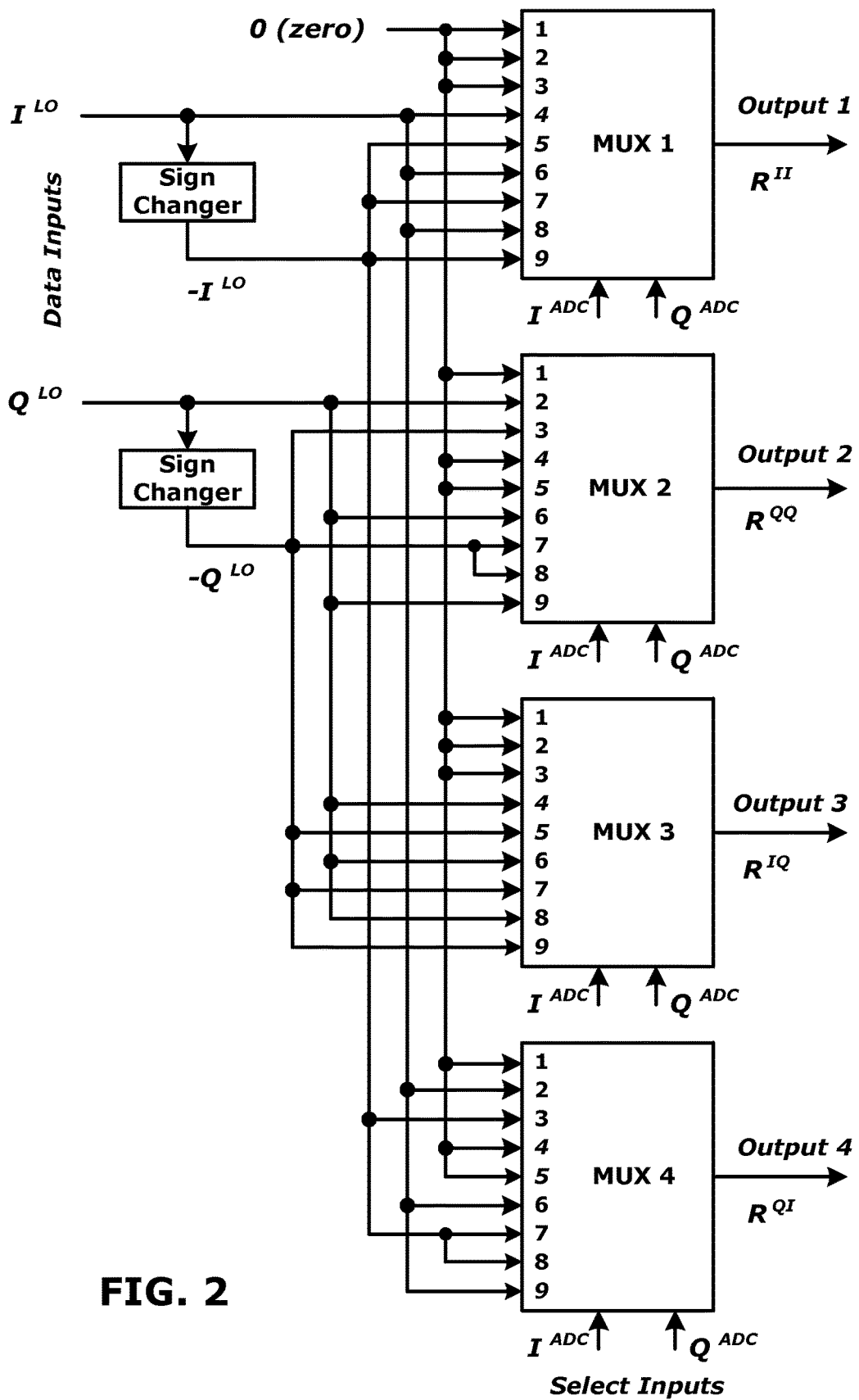
FIG. 2 is a functional diagram for a MUX block.

An example of a logic diagram for MUX block is shown in FIG. 2.

Zero number is supplied to data inputs 1, 2, 3 of the multiplexer 1, to the data inputs 1, 4, 5 of the multiplexer 2, to data inputs 1, 2, 3 of the multiplexer 3 and to data inputs 1, 4, 5 of the multiplexer 4.

Component $I^{LO}$ is supplied to data inputs 4, 6, 8 of the multiplexer 1 and to the data inputs 2, 6, 9 of the multiplexer 4.

Component $I^{LO}$ with the opposite sign is supplied to data inputs 5, 7, 9 of the multiplexer 1 and to the data inputs 3, 7, 8 of the multiplexer 4.

Component $Q^{LO}$ is supplied to data inputs 2, 6, 9 of the multiplexer 2 and to the data inputs 4, 6, 8 of the multiplexer 3.

Component $Q^{LO}$ with the opposite sign is supplied to data inputs 3, 7, 8 of the multiplexer 2 and to the data inputs 5, 7, 9 of the multiplexer 3.

The real numbers $R_n^{II}$, $R_n^{QQ}$, $R_n^{IQ}$, $R_n^{QI}$ are written into the first block of registers 14, comprising four registers.

A block of adders 15 produces a complex up-converted signal with quadrature components ($I_n^U$, $Q_n^U$) and a complex down-converted signal with quadrature components ($I_n^D$, $Q_n^D$) by the following formulas:

$$\left. \begin{array}{l} I_n^U = R_n^{II} - R_n^{QQ} \\ Q_n^U = R_n^{IQ} + R_n^{QI} \end{array} \right\} \quad (7)$$

$$\left. \begin{array}{l} I_n^D = R_n^{II} + R_n^{QQ} \\ Q_n^D = R_n^{IQ} + R_n^{QI} \end{array} \right\} \quad (8)$$

A spectrum of the up-converted signal with the quadrature components (7) is shown in FIG. 3c and a spectrum of the down converted signal with the quadrature components (8) is shown in FIG. 3d. Thus, a MUX block 13, a local quadrature oscillator 12, a first block of registers and a block of adders perform the role of a dual up/down frequency converter.

The complex samples (7) and (8) are inputted to a block of accumulators 16 comprising four accumulators with reset, which accumulates M samples (M>>1) at a constant frequency of the local oscillator:

$$\left. \begin{array}{l} I_m^{U,A} = \sum_{i=0}^{i=M-1} I_{i+(m-1) \cdot M}^U \\ Q_m^{U,A} = \sum_{i=0}^{i=M-1} Q_{i+(m-1) \cdot M}^U \end{array} \right\}$$

$$I_m^{D,A} = \sum_{i=0}^{i=M-1} I_{i+(m-1) \cdot M}^{D}$$

$$Q_m^{D,A} = \sum_{i=0}^{i=M-1} Q_{i+(m-1) \cdot M}^{D}$$

The resultant values $I_m^{U,A}$, $Q_m^{U,A}$, $I_m^{D,A}$, $Q_m^{D,A}$ are divided by a coefficient $2^K$ ($2^K \leq M$) by shifting in K bits toward LSBs and are written into four registers of the second block of registers 17, i.e.:

$$I_m^{U,K} = I_m^{U,A}/2^K,$$

$$Q_m^{U,K} = Q_m^{U,A}/2^K,$$

$$I_m^{D,K} = I_m^{D,A}/2^K,$$

$$Q_m^{D,K} = Q_m^{D,A}/2^K,$$

Then all four accumulators are reset to zero; wherein the secondary sampling frequency becomes equal to $F_M = f_s/M$ (down sampling by an integer factor, M).

A level detector 18 produces an estimate of vector length $V_m^U$, $V_m^D$ with complex quadrature samples $(I_m^{U,K}, Q_m^{U,K})$ and $(I_m^{D,K}, Q_m^{D,K})$ respectively of the second block of registers using an algorithm as described below. The level $\hat{V}_m^U$ is an estimate of the input signal spectrum at frequency point $-f_{LO}$ and level $\hat{V}_m^D$ is an estimate of the input signal spectrum at frequency point $+f_{LO}$. Exact values of $V_m^U$, $V_m^D$ can be calculated by formulas based on the Pythagorean theorem:

$$V_m^U = \sqrt{(I_m^{U,K})^2 + (Q_m^{U,K})^2}$$

$$V_m^D = \sqrt{(I_m^{D,K})^2 + (Q_m^{D,K})^2}.$$

Calculations based on the Pythagorean theorem require a lot of computationally intensive operations. However, an estimate of the vector length with acceptable accuracy can be obtained using relatively simple algorithms. In this case, the level detector produces a rough estimate of vector length for each input vector using the following successive steps:

a) forming auxiliary vector with orthogonal components (X, Y), where X=max(|x|, |y|), Y=min(|x|, |y|), x, y—orthogonal components of the input vector V; where the auxiliary vector located in the (0, π/4) octant;

b) finding in the (0, π/4) octant a preset sector which contains the auxiliary vector;

c) selecting a linear equation corresponding to the sector found;

d) solving the linear equation with preset coefficients.

This approach is illustrated using an example of preselected octant with borders (0, π/4). The auxiliary vector with orthogonal components (X, Y), where X=max(|x|, |y|), Y=min(|x|, |y|), x, y are orthogonal components of input vector, has the same length as the input vector and is located in octant (0, π/4).

FIG. 4 shows an example of the flowchart of a simple algorithm of estimating for the case of only sector (S=1) with borders (0, π/4). A Ve estimate of V vector length is:

$$Ve = X + C_1 * Y/D_1,$$

here $C_1$ and $D_1$ are the preset constant numbers.
For example, when $C_1$ and $D_1$ are preset $$C_1 = 21, D_1 = 64,$$

the Ve estimate has an maximum error $\epsilon_{max} = 100 * |V - Ve|/V = 5.68\%$.

FIG. 5 shows an example of the flowchart of the estimation algorithm when octant (0, π/4) is divided into two (S=2) sectors:

$\theta_1$ with borders (0, arctan $(B_1/A_1)$) and
$\theta_2$ with borders (arctan $(B_1/A_1)$, π/4);
here $A_1$ and $B_1$ are the preset constants.
And Ve estimate of V vector length is:
$Ve = X + C_1 * Y/D_1$ for the $\theta_1$ sector, and
$Ve = X + C_2 * Y/D_2$ for the $\theta_2$ sector;
here $C_1$, $D_1$ and $C_2$, $D_2$ are the preset constant numbers.
For example, if the following parameters are preset $$A_1 = 93, B_1 = 64,$$

$$C_1 = 1, D_1 = 4,$$

$$C_2 = 47, D_2 = 128,$$

the Ve estimate has maximum error $\epsilon_{max} = 3.45\%$.

FIG. 6 shows an example of the flowchart of the estimation algorithm when octant (0, π/4) is divided into three (S=3) sectors:

$\theta_1$ with borders (0, arctan $(B_1/A_1)$),
$\theta_2$ with borders (arctan $(B_1/A_1)$, arctan $(B_2/A_2)$) and
$\theta_3$ with borders (arctan $(B_2/A_2)$, π/4);
here $A_1$, $B_1$ and $A_2$, $B_2$ are the preset constant numbers.
and Ve estimate of V vector length is:
$Ve = X + C_1 * Y/D_1$ for the $\theta_1$ sector,
$Ve = X + C_2 * Y/D_2$ for the $\theta_2$ sector and
$Ve = X + C_3 * Y/D_3$ for the $\theta_3$ sector;
here $C_1$, $D_1$, $C_2$, $D_2$ and $C_3$, $D_3$ are the preset constant numbers.

For example, if the following parameters are preset $$A_1 = 7, B_1 = 4,$$

$$A_2 = 81, B_2 = 64,$$

$$C_1 = 7, D_1 = 32,$$

$$C_2 = 5, D_2 = 16,$$

$$C_3 = 49, D_3 = 128,$$

the Ve estimate has maximum error $\epsilon_{max} = 2.37\%$.

FIG. 7 shows an example of the flowchart of the estimation algorithm when octant (0, π/4) is divided into four (S=4) sectors:

$\theta_1$ with borders (0, arctan $(B_1/A_1)$),
$\theta_2$ with borders (arctan $(B_1/A_1)$, arctan $(B_2/A_2)$),
$\theta_3$ with borders (arctan $(B_2/A_2)$, arctan $(B_3/A_3)$) and
$\theta_4$ with borders (arctan $(B_3/A_3)$, π/4);
here $A_1$, $B_1$, $A_2$, $B_2$ and $A_3$, $B_3$ are the preset constant numbers, and Ve estimate of V vector length is:
$Ve = X + C_1 * Y/D_1$ for the $\theta_1$ sector,
$Ve = X + C_2 * Y/D_2$ for the $\theta_2$ sector,
$Ve = X + C_3 * Y/D_3$ for the $\theta_3$ sector, and
$Ve = X + C_4 * Y/D_4$ for the $\theta_4$ sector;
here $C_1$, $D_1$, $C_2$, $D_2$, $C_3$, $D_3$ and $C_4$, $D_4$ are the preset constant numbers.

For example, if the following parameters are preset (the constants were chosen empirically):

$$A_1 = 257, B_1 = 128,$$

$$A_2 = 95, B_2 = 64,$$

$$A_3 = 19, B_3 = 16,$$

$$C_1 = 25, D_1 = 128,$$

$$C_2 = 35, D_2 = 128,$$

$C_3=43$, $D_3=128$, $C_4=25$, $D_4=64$, the Ve estimate has maximum error $\epsilon_{max}=1.89\%$.

The higher the S value, the greater the potential accuracy of estimate of vector length.

All dividers are multiple of two in the above examples; therefore, the division operation can be performed with help of the shift operation.

A data analysis and collection logic 19 that receives spectrum data from the level detector output executes an analysis of data and sequentially stores them within one scanning period after which the spectrum data is updated, the spectral data may be used, e.g., for a display.

A sweep and data collection controller 20 sends a sweep signal to the frequency control input of LO to control the LO by stepwise changing of frequency in the range (0, fs/2), sequentially setting N>>1 of equidistant frequency values fn=fs*(2n−1)/4N, where n=1, 2, . . . , N; wherein each accumulator of the block of accumulators accumulates M samples at each frequency fn: M=floor[k*N] (The floor function is also called the "greatest integer" or "entier" function, see, for example, http:**en.wikipedia.org/wiki/Floor_and_ceiling_functions), where constant k is selected from the range (0.5, . . . , 5.0); wherein the spectrum analyzer forms 2N of spectrum points in the range (−fs/2, +fs/2) during each sweep period. The sweep controller synchronizes the spectrum analyzer sweep to the recirculating memory of a data analysis and storing logic.

Having thus described the invention, it should be apparent to those skilled in the art that certain advantages of the described apparatus have been achieved.

It should also be appreciated that various modifications, adaptations, and alternative embodiments thereof may be made within the scope and spirit of the present invention. The invention is further defined by the following claims.

What is claimed is:

1. A digital sweep type spectrum analyzer with up/down frequency conversion, which provides a frequency spectrum of a complex analog input signal, the analyzer comprising:
   (i) two three-level analog-to-digital converters (ADC), whose inputs are analog quadrature components $I^a(t)$, $Q^a(t)$ of the complex input signal and whose digital quadrature output ($I^{ADC}$, $Q^{ADC}$) is quantized into three levels (−1; 0; +1),
      wherein an ADC sampling frequency fs corresponds to a bandwidth $B_{in}$ of the complex input signal (fs≥$B_{in}$);
   (ii) a quadrature local oscillator (LO), which generates a digital complex sinusoid with quadrature components ($I^{LO}$, $Q^{LO}$) based on a sweep signal at its frequency control input;
   (iii) a MUX block comprising four 9-to-1 multiplexers MUX 1, MUX 2, MUX 3, MUX 4 whose selected inputs are connected to the outputs of the first and second ADC and whose data inputs connected to the quadrature components ($I^{LO}$, $Q^{LO}$), wherein the MUX block generates, without using multiplication, real numbers as follows:

$R^{II}=I^{ADC}*I^{LO}$, $R^{QQ}=Q^{ADC}*Q^{LO}$, $R^{IQ}=I^{ADC}*Q^{LO}$, $R^{QI}=Q^{ADC}*I^{LO}$;

wherein the four 9-to-1 multiplexers MUX 1, MUX 2, MUX 3, MUX 4 operate as follows:

| | Select inputs | | Outputs | | | |
|---|---|---|---|---|---|---|
| | $I^{ADC}$ | $Q^{ADC}$ | MUX 1 $R^{II}$ | MUX 2 $R^{QQ}$ | MUX 3 $R^{IQ}$ | MUX 4 $R^{QI}$ |
| 1) | 0 | 0 | 0 | 0 | 0 | 0 |
| 2) | 0 | +1 | 0 | $Q^{LO}$ | 0 | $I^{LO}$ |
| 3) | 0 | −1 | 0 | $-Q^{LO}$ | 0 | $-I^{LO}$ |
| 4) | +1 | 0 | $I^{LO}$ | 0 | $Q^{LO}$ | 0 |
| 5) | −1 | 0 | $-I^{LO}$ | 0 | $-Q^{LO}$ | 0 |
| 6) | +1 | +1 | $I^{LO}$ | $Q^{LO}$ | $Q^{LO}$ | $I^{LO}$ |
| 7) | −1 | −1 | $-I^{LO}$ | $-Q^{LO}$ | $-Q^{LO}$ | $-I^{LO}$ |
| 8) | +1 | −1 | $I^{LO}$ | $-Q^{LO}$ | $Q^{LO}$ | $-I^{LO}$ |
| 9) | −1 | +1 | $-I^{LO}$ | $Q^{LO}$ | $-Q^{LO}$ | $I^{LO}$ |

(iv) a first block of registers comprising four registers connected to respective outputs of the MUX block;
(v) a block of adders comprising four adders, whose inputs are connected to registers of the first block of registers,
   wherein the block of adders produces a complex up-converted signal with quadrature components ($I^U$, $Q^U$) and a complex down-converted signal with quadrature components ($I^D$, $Q^D$) as follows:

$I^U=R^{II}-R^{QQ}$, $Q^U=R^{IQ}+R^{QI}$, $I^D=R^{II}+R^{QQ}$, $Q^D=-R^{IQ}+R^{QI}$;

(vi) a second block of registers comprising four registers;
(vii) a block of accumulators comprising four accumulators whose inputs are fed from the outputs of the block of adders,
   wherein every accumulator accumulates M samples (M>>1) respectively $I^U$, $Q^U$, $I^D$, $Q^D$ at a constant frequency of the LO, then the resulting values $I_m^{U,A}$, $Q_m^{U,A}$, $I_m^{D,A}$, $Q_m^{D,A}$ are divided by a coefficient $2^K$ ($2^K \leq M$) by shifting by K bits toward a least significant bit (LSB) and resulting values $I_m^{U,K}$, $Q_m^{U,K}$, $I_m^{D,K}$, $Q_m^{D,K}$ are written into the four registers of the second block of registers, then all four accumulators are reset to zero and the process is repeated for the next frequency of the LO;
(viii) a level detector that estimates vector levels $V^U$ and $V^D$ with complex quadrature samples ($I^{U,K}$, $Q^{U,K}$) and ($I^{D,K}$, $Q^{D,K}$) respectively of the second block of registers, wherein the level $V^U$ is an estimate of the input signal spectrum at a frequency point $-f_{LO}$ and the level $V^D$ is an estimate of the input signal spectrum at a frequency point $+f_{LO}$;
(ix) a data analysis and collection logic that receives spectrum data from the level detector, analyzes the spectrum data and sequentially stores the spectrum data within one scanning period, after which the spectrum data is updated;
(x) a sweep and data collection controller that sends a sweep signal to frequency control input of the LO to control the LO by a stepwise change of frequency in a range (0, +fs/2), sequentially setting N>>1 of equidistant frequency values fn=fs*(2n−1)/4N, where n=1, 2, . . . , N, wherein each accumulator of the block of accumulators accumulates M samples at each frequency fn: M=floor[k*N], where constant k is selected from a range (0.5, . . . , 5.0), wherein the spectrum analyzer forms 2N spectrum points in a range (−fs/2, +fs/2) during each sweep period.

2. The digital spectrum analyzer of claim 1, wherein the data analysis and collection logic analyzes the spectrum data to detect presence of narrowband interference frequencies for interference rejection.

3. The digital spectrum analyzer of claim 1, wherein the level detector produces a rough estimate of vector length for each input vector using the following successive steps:

d) forming auxiliary vector with orthogonal components (X, Y), where X=max(|x|, |y|), Y=min(|x|, |y|), x, y—orthogonal components of the input vector, wherein the auxiliary vector is located in the (0, π/4) octant;

e) finding in the (0, π/4) octant a preset sector, which contains the auxiliary vector;

f) selecting a linear equation corresponding to the found sector; and g) solving the linear equation with preset coefficients.

4. The digital spectrum analyzer of claim 1, further comprising displaying the spectrum data to a user.

5. A digital sweep type spectrum analyzer with up/down frequency conversion, the analyzer comprising:

(i) two analog-to-digital converters (ADCs), whose inputs are analog quadrature components $I^a(t)$, $Q^a(t)$ of a complex input signal and whose digital quadrature output is ($I^{ADC}$, $Q^{ADC}$);

(ii) a quadrature local oscillator (LO), which generates a digital complex sinusoid with quadrature components ($I^{LO}$, $Q^{LO}$) based on a sweep signal;

(iii) a MUX block comprising four multiplexers whose selected inputs are connected to the outputs of the two ADCs and whose data inputs receive the quadrature components ($I^{LO}$, $Q^{LO}$), wherein the MUX block generates real numbers as follows:

$R^{II} = I^{ADC} * I^{LO}$, $R^{QQ} = Q^{ADC} * Q^{LO}$, $R^{IQ} = I^{ADC} * Q^{LO}$, $R^{QI} = Q^{ADC} * I^{LO}$;

(iv) a first block of registers connected to respective outputs of the MUX block;

(v) a block of adders whose inputs are connected to the first block of registers, wherein the block of adders produces a complex up-converted signal with quadrature components ($I^U$, $Q^U$) and a complex down-converted signal with quadrature components ($I^D$, $Q^D$) as follows:

$I^U = R^{II} - R^{QQ}$, $Q^U = R^{IQ} + R^{QI}$, $I^D = R^{II} + R^{QQ}$, $Q^D = -R^{IQ} + R^{QI}$;

(vi) a second block of registers;

(vii) a block of accumulators whose inputs are fed from the block of adders, wherein every accumulator accumulates M samples respectively of $I^U$, $Q^U$, $I^D$, $Q^D$ at a constant frequency of the LO, the resulting values $I_m^{U,A}$, $Q_m^{U,A}$, $I_m^{D,A}$, $Q_m^{D,A}$ are divided by $2^K$ ($2^K \leq M$) by shifting by K bits toward a least significant bit (LSB) and resulting values $I_m^{U,K}$, $Q_m^{U,K}$, $I_m^{D,K}$, $Q_m^{D,K}$ are written into the second block of registers, and then the accumulators are reset to zero and the steps are repeated for the next frequency of the LO;

(viii) a level detector that estimates vector levels $V^U$ and $V^D$ with complex quadrature samples ($I^{U,K}$, $Q^{U,K}$) and ($I^{D,K}$, $Q^{D,K}$) respectively of the second block of registers, where $V^U$ is an estimate of an input signal spectrum at a frequency point $-f_{LO}$ and $V^D$ is an estimate of the input signal spectrum at a frequency point $+f_{LO}$;

(ix) a controller that sends the sweep signal to the LO to control the LO by a change of frequency in a range (0, +fs/2), sequentially setting N>>1 of equidistant frequency values fn=fs*(2n−1)/4N, where n=1, 2, . . . , N, wherein each accumulator of the block of accumulators accumulates M samples at each frequency fn: M=floor[k*N], where k is a constant, and wherein the spectrum analyzer forms 2N spectrum points in a range (−fs/2, +fs/2) during each sweep period.

6. The digital spectrum analyzer of claim 5, further comprising a data analysis and collection logic that receives spectrum data from the level detector, analyzes the spectrum data and stores the spectrum data within one scanning period.

7. The digital spectrum analyzer of claim 6, wherein the data analysis and collection logic analyzes the spectrum data to detect presence of narrowband interference frequencies for interference rejection.

8. The digital spectrum analyzer of claim 5, wherein the level detector produces a rough estimate of vector length for each input vector using the following successive steps:

h) forming auxiliary vector with orthogonal components (X, Y), where X=max(|x|, |y|), Y=min(|x|, |y|), x, y—orthogonal components of the input vector, wherein the auxiliary vector is located in the (0, π/4) octant;

i) finding in the (0, π/4) octant a preset sector, which contains the auxiliary vector;

j) selecting a linear equation corresponding to the found sector; and k) solving the linear equation with preset coefficients.

9. The digital spectrum analyzer of claim 5, further comprising displaying the spectrum data to a user.

10. The digital spectrum analyzer of claim 5, wherein output of the two ADCs is quantized into three levels (−1, 0, +1).

11. The digital spectrum analyzer of claim 5, wherein a sampling frequency fs of the ADCs corresponds to a bandwidth $B_{in}$ of the complex input signal (fs≥$B_{in}$).

12. The digital spectrum analyzer of claim 5, wherein the four multiplexers (MUX 1, MUX 2, MUX 3, MUX 4) operate as follows:

| Select inputs | | Outputs | | | |
| --- | --- | --- | --- | --- | --- |
| | | MUX 1 | MUX 2 | MUX 3 | MUX 4 |
| $I^{ADC}$ | $Q^{ADC}$ | $R^{II}$ | $R^{QQ}$ | $R^{IQ}$ | $R^{QI}$ |
| 1) 0 | 0 | 0 | 0 | 0 | 0 |
| 2) 0 | +1 | 0 | $Q^{LO}$ | 0 | $I^{LO}$ |

-continued

| Select inputs | | Outputs | | | |
|---|---|---|---|---|---|
| $I^{ADC}$ | $Q^{ADC}$ | MUX 1 $R^{II}$ | MUX 2 $R^{QQ}$ | MUX 3 $R^{IQ}$ | MUX 4 $R^{QI}$ |
| 3) 0 | −1 | 0 | $-Q^{LO}$ | 0 | $-I^{LO}$ |
| 4) +1 | 0 | $I^{LO}$ | 0 | $Q^{LO}$ | 0 |
| 5) −1 | 0 | $-I^{LO}$ | 0 | $-Q^{LO}$ | 0 |
| 6) +1 | +1 | $I^{LO}$ | $Q^{LO}$ | $Q^{LO}$ | $I^{LO}$ |
| 7) −1 | −1 | $-I^{LO}$ | $-Q^{LO}$ | $-Q^{LO}$ | $-I^{LO}$ |
| 8) +1 | −1 | $I^{LO}$ | $-Q^{LO}$ | $Q^{LO}$ | $-I^{LO}$ |
| 9) −1 | +1 | $-I^{LO}$ | $Q^{LO}$ | $-Q^{LO}$ | $I^{LO}$. |

13. The digital spectrum analyzer of claim 5, wherein the constant k is in a range (0.5-5.0).

14. A digital sweep type spectrum analyzer with up/down frequency conversion, the analyzer comprising:

(i) two analog-to-digital converters (ADCs), whose inputs are analog quadrature components of a complex input signal and that produce a digital quadrature output ($I^{ADC}$, $Q^{ADC}$);

(ii) a quadrature local oscillator (LO), which generates a digital complex sinusoid with quadrature components ($I^{LO}$, $Q^{LO}$);

(iii) a MUX block that generates real numbers based on ($I^{ADC}$, $Q^{ADC}$) and ($I^{LO}$, $Q^{LO}$) as follows:

$$R^{II}=I^{ADC}*I^{LO},$$

$$R^{QQ}=Q^{ADC}*Q^{LO},$$

$$R^{IQ}=I^{ADC}*Q^{LO},$$

$$R^{QI}=Q^{ADC}*I^{LO};$$

(iv) a first block of registers connected to outputs of the MUX block;

(v) a block of adders whose inputs are connected to the first block of registers, wherein the block of adders produces a complex up-converted signal ($I^U$, $Q^U$) and a complex down-converted signal ($I^D$, $Q^D$) as follows:

$$I^U=R^{II}-R^{QQ};$$

$$Q^U=R^{IQ}+R^{QI},$$

$$I^D=R^{II}+R^{QQ};$$

$$Q^D=-R^{IQ}+R^{QI};$$

(vi) a second block of registers;

(vii) a block of accumulators receiving inputs from the block of adders,
wherein each accumulator accumulates M samples respectively of $I^U$, $Q^U$, $I^D$, $Q^D$ at a frequency of the LO, the resulting values $I_m^{U,A}$, $Q_m^{U,A}$, $I_m^{D,A}$, $Q_m^{D,A}$ are divided by $2^K$ ($2^K \leq M$) by shifting by K bits toward a least significant bit (LSB) and resulting values $I_m^{U,K}$, $Q_m^{U,K}$, $I_m^{D,K}$, $Q_m^{D,K}$ are written into the second block of registers, and then the accumulators are reset to zero and the steps are repeated for the next frequency of the LO;

(viii) a level detector that estimates a spectrum of the complex input signal at frequency points $-f_{LO}$ and $+f_{LO}$, using the values $I_m^{U,K}$, $Q_m^{U,K}$, $I_m^{D,K}$, $Q_m^{D,K}$;

(ix) a controller that sends a sweep signal to the LO to change a frequency of the LO in a range (0, +fs/2), sequentially setting N>>1 of frequency values fn=fs*(2n−1)/4N, where n=1, 2, . . . , N,
wherein each accumulator accumulates M samples at each fn: M=floor[k*N], where k is a constant, and
wherein the spectrum analyzer forms spectrum points in a range (−fs/2, +fs/2).

* * * * *